United States Patent [19]
Gregorian

[11] 4,306,197
[45] Dec. 15, 1981

[54] SWITCHED-CAPACITOR ELLIPTIC FILTER

[75] Inventor: Roubik Gregorian, Santa Clara, Calif.

[73] Assignee: American Microsystems, Inc., Santa Clara, Calif.

[21] Appl. No.: 104,435

[22] Filed: Dec. 17, 1979

[51] Int. Cl.³ .............................................. H03F 1/34
[52] U.S. Cl. .................................... 330/107; 330/151
[58] Field of Search ................ 330/51, 107, 109, 151; 328/167; 307/233 R, 295; 333/173

[56] References Cited
PUBLICATIONS
Allstot et al., "MOS Switched Capacitor Ladder Filters", *IEEE Journal of Solid-State Circuits*, vol. SC-13, No. 6, Dec. 1978, pp. 806–814.

*Primary Examiner*—James B. Mullins
*Attorney, Agent, or Firm*—Skjerven, Morrill, Jensen, MacPherson & Drucker

[57] ABSTRACT

An elliptic state variable filter uses switched capacitors controlled by an arrangement of switches that provides for a frequency response independent of stray capacitors in the circuit. The filter section comprises three integrating operational amplifiers connected in series, with a feedback connection between the output of the second operational amplifier and the circuit input to the first operational amplifier. Signals via a feed forward connection from the circuit input and the outputs of the first and second operational amplifier are summed by the third operational amplifier. Transmission zeros of the filter transfer function are realized independent of poles and with a feed forward arrangement which places them inherently on the unit circle and produces infinite loss at each zero frequency despite variations in capacitor ratios in the circuit.

7 Claims, 5 Drawing Figures

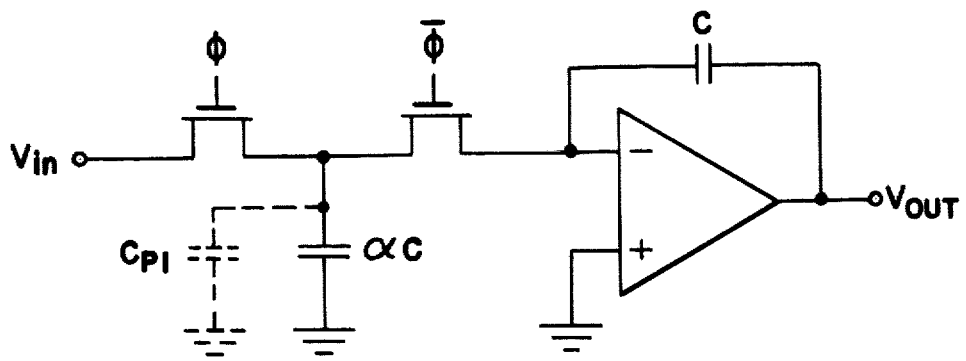
FIG_1 (PRIOR ART)
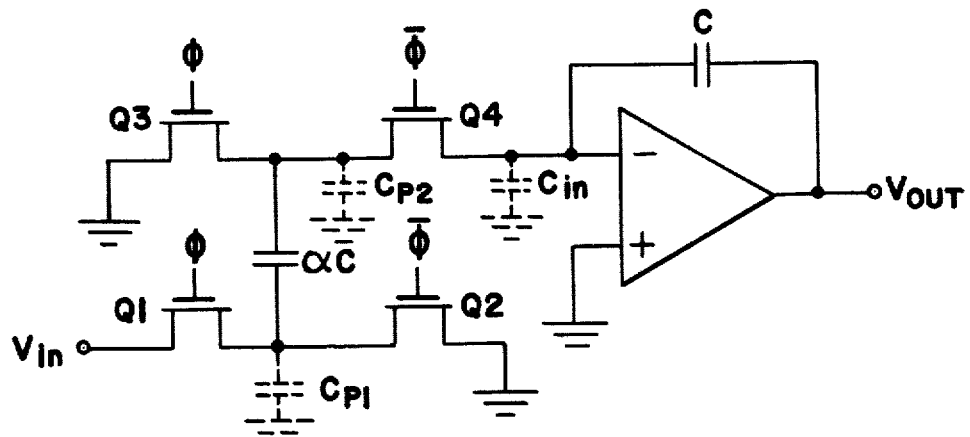
FIG_2
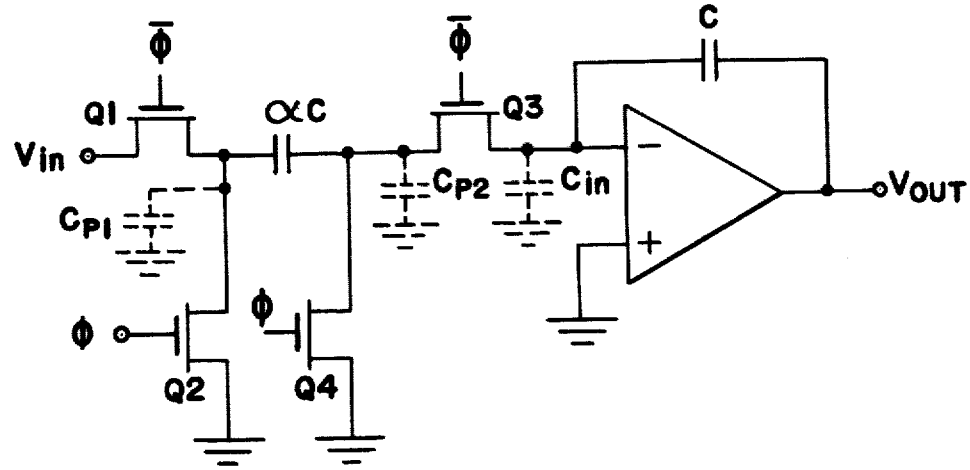
FIG_3

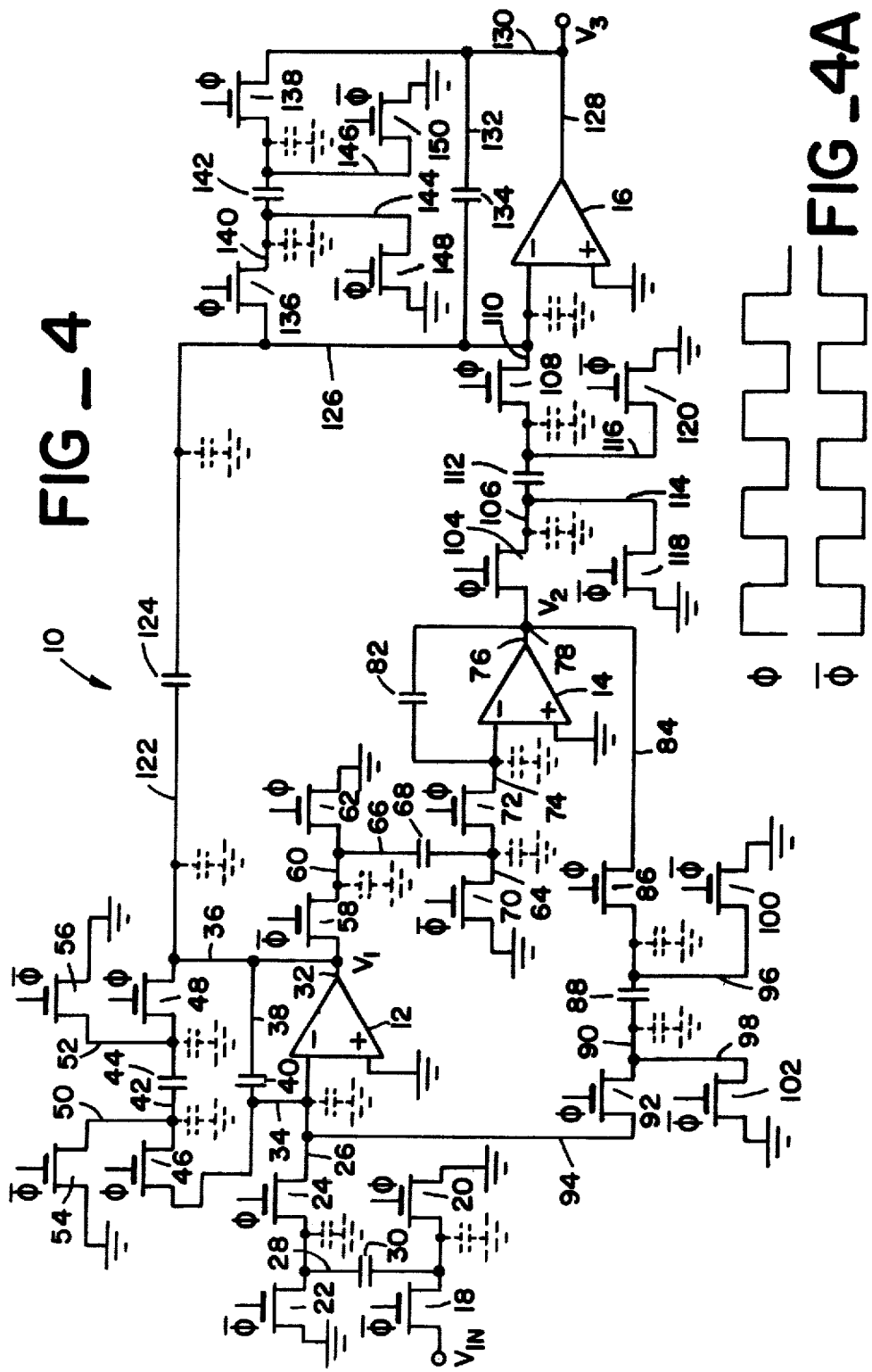

SWITCHED-CAPACITOR ELLIPTIC FILTER

BACKGROUND OF THE INVENTION

This invention relates to electronic filters and more particularly to an improved switched-capacitor elliptic state variable filter circuit that is adaptable for implementation as an integrated circuit device.

In my previous U.S. Patent, application, Ser. No. 940,473, filed on Sept. 8, 1978, and now U.S. Pat. No. 4,179,665 an elliptic filter circuit is described using switched capacitors with three operational amplifiers connected in series. This circuit utilizes a feedback connection between the output of the second operational amplifier and the input of the first operational amplifier (which is also the input to the circuit) and a feed forward connection from the input voltage source and the output of the first operational amplifier. These feed forward signals are combined with the output from the second operational amplifier. A plurality of switched capacitors in the circuit for controlling the inputs to the various operational amplifiers are all connected to a two-phase clock driver operated on a preselected frequency. In the transfer function of such a filter circuit it is essential that the transmission zero in the "z" domain be on the unit circle so that there is infinite attenuation at that zero frequency.

With the previous circuit, the transmission zero of the transfer function was forced onto the unit circle by selecting precise capacitor ratios. Thus, if the capacitor values varied from the calculated design specifications and the ratios were off even a small amount, the transmission zero was not exactly on the unit circle but was either inside or outside. This caused a filter frequency response that did not provide infinite attenuation at the zero frequency and the desirable sharp roll-off of the frequency/loss curve. The present invention solves this problem by providing a filter circuit that has infinite attenuation at the zero frequency regardless of the capacitor ratio.

Another problem with prior switched-capacitor filters, particularly when incorporated within large monolithic integrated circuits, was that they tended to be sensitive to parasitic capacitances. So called "stray" capacitors are caused by the junction capacitance of switches and line substrate capacitance created by typical device topology. Since frequency response has a relatively high sensitivity to capacitor ratio errors, it was necessary to make the required circuit capacitors relatively large in order to overcome or reduce the effect of such stray capacitance. Since these stray or parasitic capacitances are mainly junction type capacitances, they are voltage dependent and non-linear and therefore have the added disadvantage of causing harmonic distortion in the filter. The present invention solves these problems by completely eliminating the effects of stray capacitors, thereby allowing the regular circuit capacitors to be made of minimum size and conserving essential chip area while also improving the filter performance by increasing harmonic linearity.

BRIEF SUMMARY OF THE INVENTION

A filter circuit according to the present invention comprises first, second and third operational amplifiers which are connected through a series of switched capacitors controlled by alternating clock signals and including one capacitor in a feed forward arrangement. The circuit input, is for example, from an analog voltage source supplied through a clocked MOS switch and a capacitor to the first operational amplifier. The output of the first operational amplifier is provided through a capacitor connected to the input of the second operational amplifier and also in a feed forward arrangement through another capacitor to the input of the third operational amplifier. The output of the second operational amplifier is provided through a capacitor to the input of the third operational amplifier and also as a feedback loop through a capacitor to the input of the first operational amplifier. This arrangement causes the transmission zero in the numerator of the circuit transfer function to be always on the unit circle in the "z" domain regardless of the ratios for the various capacitors. Thus, infinite attenuation is achieved at the transmission zero frequency, thereby assuring a highly accurate frequency response for the circuit.

Each switched capacitor in the circuit is controlled by an MOS switch controlled by alternating clock signals and they are also connected to ground through additional switch elements in order to eliminate the effects of stray capacitance. In one form of this MOS switch, a capacitor is provided between switch elements controlled by the same clock and opposite plates of the capacitor are connected through additional switch elements (controlled by the alternate clock phase) to ground. Thus, when one plate of the capacitor is charged on one clock phase, the stray capacitance is also charged, but as the next or alternate clock phase occurs, the stray capacitance goes to ground instead of becoming part of the charge being integrated. In a second type of MOS switch, the capacitor is between switch elements connected to opposite clock phases. Here, the stray capacitance acquires some charge temporarily from the capacitor but loses it to the amplifier capacitor as the inner switch element turns on. Thus, again the brief transient does not affect the circuit operation. With such double switch sections throughout the circuit, the performance of the filter becomes totally independent of all such stray capacitance.

In summary, it is therefore a general object of the present invention to provide an improved switched-capacitor type elliptic filter. More specifically, the objects of the invention are to provide a filter circuit that: (1) is insensitive to all parasitic elements in a monolithic integrated circuit device; (2) has a frequency response with a relatively low sensitivity to capacitor ratio errors; (3) has a transfer function with transmission zeros which are inherently on the unit circle, thereby producing infinite loss at zero frequency; (4) has a transfer function with transmission zeros that are realized independent of poles; (5) can be produced as part of an integrated circuit device requiring less silicon area than comparable filter devices heretofore devised; and (6) uses less capacitors than prior filters of the same type for the same transfer function.

Other objects, advantages and features of the invention will become apparent from the following detailed description of one embodiment presented in conjunction with the accompanying drawing.

BRIEF DESCRIPTION OF THE DRAWING

FIG. 1 is a circuit diagram for an integrator of the prior art;

FIG. 2 is a circuit diagram for an integrator arrangement with switches for eliminating stray capacitance;

FIG. 3 is a circuit diagram for an integrator with an alternate switch arrangement for eliminating stray capacitance;

FIG. 4 is a circuit diagram for a filter embodying the principles of the present invention;

FIG. 4A is a timing diagram for the clocks $\phi$ and $\overline{\phi}$ that operate the circuit of FIG. 4.

DETAILED DESCRIPTION OF EMBODIMENT

Referring to the drawing, FIG. 1 shows a basic integrator of the type used in the prior art for simulated ladder filters. Here, the input voltage $V_{in}$ is supplied through a first MOS switch whose gate is connected to an alternating clock phase $\phi$ and through a second switch whose gate is connected to the opposite clock phase $\overline{\phi}$ to the negative input of an integrating operational amplifier. From a junction between these two switch elements is a lead containing a capacitor $\alpha C$ connected to ground. The dotted line indicates a stray capacitance $C_{p1}$ connected to ground from the top plate of capacitor $\alpha C$. The transfer function of this integrator (for $C_{p1}=0$) is $$H(z) = \frac{V_{out}(z)}{V_{in}(z)} = \frac{-\alpha}{-1} \tag{1}$$

This integrator section is insensitive to most stray capacitance effects, since the impedances from almost all nodes to ground are very low. However, since the stray capacitance $C_{p1}$ from the upper plate of $\alpha C$ to ground is in parallel with $\alpha C$, it changes the value of $\alpha$ to $\alpha + C_{p1}/C$ in eq. (1). This establishes a lower limit on $\alpha C$, and hence a lower limit on the total die area occupied by the stage. Furthermore, $C_{p1}$ includes nonlinear p-n-junction capacitance, and thus contributes to the harmonic distortion of the filter.

In order to avoid the inaccuracy and nonlinearity caused by the stray capacitance $C_{p1}$, two alternative integrator stages using different MOS switch arrangements have been developed which are immune to the effects of $C_{p1}$. The first circuit is shown by FIG. 2. Here, the input voltage $V_{in}$ is connected through a first MOS switch Q1 to a first junction from one plate of a capacitor $\alpha C$ whose other plate is connected to a second junction. One lead from this latter junction is connected through a switch Q3 to ground that is controlled by the same clock phase as the first switch and another lead from this second junction is connected through another switch Q4 to the negative input of an integrating operational amplifier. This latter switch and another switch Q2 connected to the first junction are controlled by alternating clock phase signals. Except for the absence of the negative sign, this stage has the same transfer function as that shown in FIG. 1. However, now none of the stray capacitances affect the operation. In fact, $C_{p1}$ only absorbs and discharges to ground from the input voltage source. The stray capacitance $C_{p2}$ acquires some charge from $\alpha C$ temporarily (when Q3 turns off) but then loses it to the capacitor C after Q4 turns on. Hence, except for this brief transient, it does not contribute to the operation of the stage.

A different switching circuit for eliminating stray capacitance is shown in FIG. 3 as applied to an inverting integrator which uses a series (rather than shunt) switched-capacitor. Here, the input voltage $V_{in}$ is supplied through a first MOS switch Q1 connected to one side of a capacitor $\alpha C$ whose other side is connected through another switch Q3 to the negative input of the integrating operational amplifier. These first two switches are connected to the same $\overline{\phi}$ clock phase. Connected to opposite sides of the capacitor $\alpha C$ is a pair of grounded switches Q2 and Q4 which are controlled by the alternate clock phase $\phi$. The stray capacitances $C_{p1}$, $C_{p2}$ and $C_{in}$, are indicated by dotted lines. The operation of the circuit is as follows: When clock phase $\phi=1$, or "on", Q2 and Q4 discharge capacitor $\alpha C$ and also stray capacitors $C_{p1}$ and $C_{p2}$. When clock phase $\phi$ turns to zero, capacitors $\alpha C$ and $C_{p1}$ are charged to $V_{in}$ through switches Q1 and Q3, while capacitors $C_{p2}$ and $C_{in}$ are held at virtual ground. Hence, again only the stray capacitor $C_{p1}$ absorbs charge from the input voltage source, but the total charge integrated by capacitor C of the integrator is supplied by capacitor $\alpha C$ and the stray capacitors do not participate in the operation of the circuit.

With reference to FIG. 4, an elliptic filter 10 comprising a first operational amplifier 12 for receiving an input ($V_{in}$), a second or intermediate operational amplifier 14 and a third operational amplifier 16 that produces the filter output ($V_3$). In this diagram, stray junction and line capacitances that may normally occur in the implementation of the circuit are shown in dotted lines at their various locations.

The input signal voltage ($V_{in}$) to be filtered is supplied, as from an analog voice signal, to a switch 18 in the form of an MOS device whose gate is connected to a periodic clock voltage $\overline{\phi}$. As shown in the timing diagram of FIG. 4A, alternating clock signals $\phi$ and $\overline{\phi}$ are provided at a preselected frequency (e.g., 128 KHz) from a suitable external source or an on-chip oscillator.

In a switching arrangement, as shown in FIG. 2, the MOS switch 18 is connected in series with a similar MOS switch 20 whose gate is connected to the alternating clock voltage $\phi$.

A similar pair of MOS switches 22 and 24 whose gates are connected to the clocks $\overline{\phi}$ and $\phi$, respectively, are connected together in series and to a lead 26 attached to the negative input of operational amplifier 12. The positive terminal of all three operational amplifiers is connected to ground. Connected at one end between the switches 18 and 20, and at the other end between the switches 22 and 24, is a lead 28 connected to opposite sides of a capacitor 30, also designated $\alpha_3 C_1$. Thus, during a $\overline{\phi}$ clock pulse, the input $V_{in}$ is furnished to and stored on the capacitor 30 and during the next $\phi$ clock pulse, the stored $V_{in}$ charge is furnished to the negative input operational amplifier 12.

The operational amplifier 12 has an output lead 32 providing an output $V_1$. Branching from the input lead 26 and the output lead 32 is a pair of leads 34 and 36. Connected in a first lead 38 between the leads 34 and 36 is a feedback capacitor 40 ($C_1$), and connected in a second lead 42 between leads 34 and 36 is another capacitor 44 ($\alpha_1 C_1$). Connected to the lead 42 on one side of the capacitor 44 is an MOS switch 46 whose other source/drain terminal is connected to the branch lead 34 and whose gate is connected to the $\phi$ clock. The switch 46 is part of a switching arrangement as shown in FIG. 3. Thus, on the other side of the capacitor 44 is another switch 48 whose source and drain terminals are connected to the leads 42 and 36 and whose gate is also connected to the $\phi$ clock. Now, connected to the lead 42 on opposite sides of the capacitor 44 is another pair of branching leads 50 and 52, each being connected to one source/drain terminal of a pair of MOS switches 54 and 56, respectively. The other source/drain terminals of these latter switches are connected to ground and their gates are both connected to the $\overline{\phi}$ clock source. These switches control the elimination of stray capacitance at this section of the circuit, as will be explained below.

The $V_1$ output of operational amplifier 12 in lead 30 is supplied to an MOS switch 58 whose gate is connected to the $\overline{\phi}$ clock. This latter switch is part of another switching network of the type shown in FIG. 2 and is connected by a lead 60 to another MOS switch 62 whose gate is connected to the $\phi$ clock. Interconnecting the lead 60 and a lead 64 is a lead 66 connected to opposite sides of a capacitor 68 ($\alpha_2 C_2$). The lead 64 is connected to two MOS switches 70 and 72 whose gates are connected to the $\overline{\phi}$ and $\phi$ clocks respectively.

The switch 72 is connected to the negative input of the second operational amplifier 14 via a lead 74. The output ($V_2$) of the operational amplifier 14 is provided in a lead 76 connected to a junction 78. Extending from this junction is a feedback lead 80 connected to one side of a capacitor 82 ($C_2$) whose other side is connected to the input lead 74. Another feedback lead 84 from the junction 78 is connected to one terminal of an MOS switch 86 whose other side is connected to one side of a switched capacitor 88 ($\alpha_1'C_1$) via a lead 90. The other side of this capacitor is connected to one terminal of a switch 92 whose other terminal is connected via a lead 94 to the input lead 26 for the first operational amplifier 12. The gates of switches 86 and 92 are both connected to the $\phi$ clock source and are part of switching arrangement of the type shown in FIG. 3. Thus, extending from the lead 90 on opposite sides of the capacitor 88 is a pair of branch leads 96 and 98 which are connected to a pair of MOS switches 100 and 102, respectively. The gates of these latter switches are connected to the $\overline{\phi}$ clock source and their other source/drain terminals are connected to ground as a means for eliminating stray capacitance.

A similar switching arrangement is provided for the output ($V_2$) from the second operational amplifier 14. Thus, an MOS switch 104 is connected to the junction 78 and to an interconnecting lead 106 with one side of another switch 108 whose other side is connected via a lead 110 to the negative input of operational amplifier 16. The gates of switches 104 and 108 are both connected to the $\phi$ clock. The lead 106 is connected to opposite sides of a capacitor 112 ($\alpha_5 C_3$) and extending from the lead 106 at opposite sides of this capacitor is a pair of branching leads 114 and 116 connected to another pair of MOS switches 118 and 120 respectively. The gates of these latter switches are connected to the $\overline{\phi}$ clock and their other terminals are connected to ground.

Extending from the output of the first operational amplifier 12 via the branching lead 36 is a feed forward lead 122 connected to one side of a capacitor 124 ($\alpha_4 C_3$) whose other side is connected by a lead 126 to the input lead 110 for the third operational amplifier 16.

In an arrangement similar to the first operational amplifier, the third operational amplifier has an output lead 128 and a feedback lead 130 branching from it. Connected between the lead 130 and the lead 126 is a feedback lead 132 connected to opposite sides of a capacitor 134 ($C_3$). Also connected between the leads 126 and 130 is a pair of MOS switches 136 and 138 which are themselves interconnected by a lead 140, connected to opposite sides of a capacitor 142 ($\alpha_6 C_3$). These switches are part of a switching arrangement as shown in FIG. 3, and the gates of switches 136 and 138 are connected to the $\phi$ clock source. Branching from the lead 140 at opposite sides of the capacitor 142 is a pair of leads 144 and 146 which are connected to one terminal of a pair of MOS switches 148 and 150, respectively. The gates of these latter switches are connected to the $\overline{\phi}$ clock and their other terminals are connected to ground.

As shown in FIG. 1, various stray capacitors are produced at different locations of the circuit 10 by inherent junction capacitance phenomena and line capacitance which occurs due to conventional integrated circuit topology. Each of these stray capacitors is shown in dotted lines at the approximate location where it is likely to occur and in each case, its effect on the circuit operation and on the integration of the operational amplifier, is eliminated by virtue of the additional pair of switches for each switched capacitor. Thus, at the input switch section, for example, stray capacitors would normally be present near the terminals of the MOS switches 20 and 24 on opposite sides of the capacitor 30. When $\overline{\phi}$ clock is on and switch 18 is closed, the lower stray capacitor is charged as well as the capacitor 30. However, when the alternating $\phi$ clock phase occurs, the lower stray capacitor is discharged to ground instead of affecting the capacitor 30 on the next $\overline{\phi}$ clock cycle. The same thing happens to the upper stray capacitor which is discharged to ground on the $\overline{\phi}$ clock cycle through switch 22, thereby allowing only the discharge of capacitor 30 in the input lead to operational amplifier 12. A similar grounding of all stray capacitors occurs in the circuit with every change of clock cycle.

Describing now the operation of circuit 10, it is assumed that the two-phase non-overlapping clock is continuously supplying $\phi$ and $\overline{\phi}$ pulses to the switching MOSFETs at the preselected frequency. Assume that $V_1$ (t), the output of operational amplifier 12, at $t=(n-1)$ t is $V_1 (n-1)$, etc. At a time $(n-1)$ t when clock phase $\overline{\phi}$ is "on" the capacitor 124 ($\alpha_4 C_3$) in the feed forward lead 122 is held at $V_1 (n-1)$ and capacitors 68 ($\alpha_2 C_2$) and 30 ($\alpha_3 C_1$) are charged to $V_1 (n-1)$ and $V_{in} (n-1)$ respectively, while capacitors 44 ($\alpha_1 C_1$), 88 ($\alpha_1'C_1$), 112 ($\alpha_5 C_3$) and 142 ($\alpha_6 C_3$) are discharged to zero. Now, when clock $\overline{\phi}$ goes to 0 and $\phi$ goes "on", capacitors 88 and 112 are charged to $V_2 (n)$ and capacitors 44 and 124 are charged to $V_1 (n)$ while the charge on capacitors 30 and 68 enter capacitors 40 (having capacitance $C_1$) and 82 (having capacitance $C_2$), respectively. The corresponding charge conservation equations are:

$$C_1 V_1(n) = C_1 V_1(n-1) - \alpha_1 C_1 V_1(n) - \alpha_1 C_1 V_2(n-1) + \alpha_3 C_1 V_{in}(n-1)$$

$$C_2 V_2(n) = C_2 V_2(n-1) + \alpha_2 C_2 V_1(n-1)$$

$$C_3 V_3(n) = C_3 V_3(n-1) - \alpha_6 C_3 V_3(n-1) - \alpha_5 C_3 V_2(n) - \alpha_4 C_3 [V_1(n) - V_1(n-1)]$$

or, after taking the z-transform from both sides of the above equations, we have:

$$V_1(z)[(1+\alpha_1) - z^{-1}] = -\alpha_1 V_2(z) + \alpha_3 z^{-1} V_{in}(z) \qquad \text{Eq. 2}$$

$$V_2(z)[1 - z^{-1}] = \alpha_2 z^{-1} V_1(z) \qquad \text{Eq. 3}$$

$$V_3(z)[(1+\alpha_6) - z^{-1}] = -\alpha_5 V_2(z) - \alpha_4 V_1(z)(1 - z^{-1}) \qquad \text{Eq. 4}$$

Combining equations 2-4 gives the circuit transfer function:

$$H_o(z) = \frac{-a_3 a_4}{(1 + a_1)(1 + a_6)} \times \quad \text{Eq. 5}$$

$$\frac{\left[z^2 - z\frac{(2 - a_2 a_5)}{a_4} + 1\right]}{\left[z - \frac{1}{1 + a_6}\right]\left[z^2 - z\frac{(2 + a_1 - a_1 a_2)}{1 + a_1} + \frac{1}{1 + a_1}\right]}$$

The above Eq. 5 represents the mathematical description of a third order elliptic filter characteristic with two complex conjugate poles, a real pole and two complex conjugate zeros which is provided by the circuit arrangement as described and shown in the drawing. A significant and unique factor in the above transfer function which constitutes an important feature of the circuit 10 is the fact that magnitudes of the zeros are not affected by the capacitor values $a_i$ (where "i" is equal to 1, 2, ...) and they remain on the unit circle for all $a_i$ values. In the transfer function (Eq. 5), the magnitude of the transmission zero is the constant term of the quadratic factor in the numerator and it is always "one" no matter what the capacitor values are.

The actual design of such a filter with the above transfer function according to the invention requires the selection of appropriate values for $a_i$'s, so that $|H(z)|$ for $z = e^{j\omega}$ approximates the frequency characteristic of the desired filter. These $a_i$ values of the various capacitors may be determined using procedures well known to those skilled in the art.

Assuming the selection of proper values ascertained for the capacitor elements, the circuit 10 will provide a filter with transmission zeros on the unit circle and thus, one with infinite attenuation at the zero frequency. Moreover, by elimination of all stray capacitors, using the switch elements as described, its frequency response will closely match the design characteristics. In addition, the sensitivity of the pole Q is relatively low with respect to inaccuracies in the capacitor ratios, which further increases its accuracy and versatility.

Thus, to those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. An electronic elliptic filter comprising:
   an input means connected to an input voltage source to be filtered, said input means including a first switched capacitor means;
   a first integrating operational amplifier having a non-inverting input connected to a first voltage source, an inverting input connected to said input means, and an output terminal;
   a first feedback means including a first capacitor connected between said inverting input terminal of said first integrating operational amplifier and said output terminal of said first integrating operational amplifier;
   a second feedback means including a second switched capacitor means connected between said inverting input terminal of said first integrating operational amplifier and said output terminal of said first integrating operational amplifier;
   a second integrating operational amplifier having a non-inverting input terminal connected to said first voltage source, an inverting input terminal, and an output terminal;
   a third feedback means including a second capacitor connected between said inverting input terminal of said second integrating operational amplifier and said output terminal of said second integrating operational amplifier;
   a first means for connecting, including a third switched capacitor means, connected between said output terminal of said first integrating operational amplifier and said inverting input terminal of said second integrating operational amplifier;
   a fourth feedback means including a fourth switched capacitor means connected between said inverting input terminal of said first integrating operational amplifier and said output terminal of said second integrating operational amplifier;
   a third integrating operational amplifier having a non-inverting input terminal connected to said first voltage source, an inverting input terminal, and an output terminal;
   a fifth feedback means including a third capacitor connected between said inverting input terminal of said third integrating operational amplifier and said output terminal of said third integrating operational amplifier;
   a sixth feedback means including a fifth switched capacitor means connected between said output terminal of said third integrating operational amplifier and said inverting input terminal of said third integrating operational amplifier;
   a second means for connecting including a sixth switched capacitor means connected between said inverting input terminal of said third integrating operational amplifier and said output terminal of said second integrating operational amplifier; and
   a fourth capacitor connected between said output terminal of said first integrating operational amplifier and said inverting input terminal of said third integrating operational amplifier,
   wherein each of said first, second, third, fourth, fifth and sixth switched capacitor means includes two MOSFET switching devices driven by a first clock signal representing a first phase of an alternating two phase clock source and two additional MOSFET devices driven by a second clock signal complementary to said first clock signal whereby stray capacitances in the system are grounded and do not affect the integration by the operational amplifiers, whereby an analog voltage from said input source is converted into a sampled data signal and an output voltage is produced from said third integrating operational amplifier, said output voltage containing only those frequencies in a preselected pass band.

2. The filter as described in claim 1 wherein the transmission zeros of the transfer function in the z domain are all on the unit circle, thereby providing infinite loss at the preselected zero frequency.

3. The filter as described in claim 1 wherein the transfer function for filter circuit is:

$$H_d(z) = \frac{-a_3 a_4}{(1 + a_1)(1 + a_6)} \times \frac{\left[z^2 - z\frac{(2 - a_2 a_5)}{a_4} + 1\right]}{\left[z - \frac{1}{1 + a_6}\right]\left[z^2 - z\frac{(2 + a_1 - a_1' a_2)}{1 + a_1} + \frac{1}{1 + a_1}\right]}$$

4. The filter as described in claim 1 wherein two of said four MOSFET's in each said switched capacitor means are connected to ground and are controlled by the same clock phase on their respective gates.

5. The filter as described in claim 1 wherein two of said four MOSFET's in each said switched capacitor means are connected to ground and are controlled by signals of opposite clock phase on their respective gates.

6. Structure as in claim 1 wherein said first voltage source is ground.

7. The filter as described in claim 1 wherein each said switched capacitor means comprises:

a capacitor having a first and a second plate;

first, second, third and fourth MOSFETs, each said MOSFET having a source, a drain and a gate, said source of said first MOSFET being connected to a voltage reference, said drain of said first MOSFET and said source of said second MOSFET being connected to said first plate of said capacitor, said drain of said second MOSFET being the output lead of said switched capacitor means, said source of said third MOSFET being the input lead of said switched capacitor means, said drain of said third MOSFET and said source of said fourth MOSFET being connected to said second plate of said capacitor, and said drain of said fourth MOSFET being connected to said voltage reference;

wherein the gates of said first and said third MOSFETs are driven by a first clocking signal, and the gates of said second and said fourth MOSFETs are driven by a second clocking signal, said second clocking signal being the complement of said first clocking signal.

* * * * *